US011424859B2

United States Patent
Brueggen et al.

(10) Patent No.: US 11,424,859 B2
(45) Date of Patent: Aug. 23, 2022

(54) PHYSICAL LAYER LOW-LATENCY FORWARD ERROR CORRECTION

(71) Applicant: HEWLETT PACKARD ENTERPRISE DEVELOPMENT LP, Houston, TX (US)

(72) Inventors: Christopher Michael Brueggen, Plano, TX (US); James Donald Regan, Ft. Collins, CO (US); Elene Chobanyan, Ft. Collins, CO (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 17/071,843

(22) Filed: Oct. 15, 2020

(65) Prior Publication Data

US 2022/0123860 A1  Apr. 21, 2022

(51) Int. Cl.
 *H04L 1/00* (2006.01)
 *H03M 13/09* (2006.01)
 *H03M 13/11* (2006.01)

(52) U.S. Cl.
 CPC .......... *H04L 1/0057* (2013.01); *H03M 13/09* (2013.01); *H03M 13/11* (2013.01); *H04L 1/0041* (2013.01); *H04L 1/0045* (2013.01); *H04L 1/0061* (2013.01)

(58) Field of Classification Search
 CPC ...... H03M 13/09; H03M 13/11; H03M 13/27; H04L 1/0041; H04L 1/0045; H04L 1/0057; H04L 1/0061
 See application file for complete search history.

(56) References Cited

U.S. PATENT DOCUMENTS

| 10,432,252 | B2 | 10/2019 | Bayesteh et al. |
| 10,644,834 | B1 | 5/2020 | McClellan et al. |
| 2014/0250344 | A1* | 9/2014 | Hellge .................. H03M 13/27 714/755 |
| 2019/0109752 | A1 | 4/2019 | Zhang et al. |

(Continued)

FOREIGN PATENT DOCUMENTS

WO  WO-2020025768  2/2020

OTHER PUBLICATIONS

Cai, S. et al.; "Block Markov Superposition Transmission of Bch Codes with Iterative Erasures-and-errors Decoders"; IEEE Transactions on Communications; Jan. 2019; pp. 17-27; vol. 67; issue 1; IEEE.

(Continued)

*Primary Examiner* — Shelly A Chase
(74) *Attorney, Agent, or Firm* — Sheppard Mullin Richter & Hampton LLP

(57) ABSTRACT

Systems and methods are provided for implementing forward error correction (FEC) on data transferred on a data link on the physical layer. Binary encoding can be done in accordance with a physical unit (phit) FEC format. The phit FEC format allows for correction of two bit errors and comprises a codeword having a variable bit size. Pre-coding the phit enables burst errors associated with the link to converted into bit errors. The data can be transmitted in the phit FEC format to a receiving PHY. The correctable two bit errors at one or more locations within the phit FEC format can then be corrected by decoding at the receiving PHY in accordance with the phit FEC. The FEC techniques can minimize latency in the PHY.

20 Claims, 8 Drawing Sheets

(56) References Cited

U.S. PATENT DOCUMENTS

2020/0153458 A1  5/2020  Strobel et al.
2020/0169323 A1* 5/2020  Moro ................. H04B 7/18517

OTHER PUBLICATIONS

Exascale Computing Project, "PathForward", available online at <https://web.archive.org/web/20200818160427/https://www.exascaleproject.org/research-group/pathforward/>, Aug. 18, 2018, 2 pages.
Gen-Z Consortium™, "Physical Layer Specification", version 1.1, Sep. 17, 2019, pp. 1-224.

* cited by examiner

PHYSICAL LAYER LOW-LATENCY FORWARD ERROR CORRECTION

DESCRIPTION OF RELATED ART

Computer systems are often designed based on the paradigm that the CPU memory pair is fast, while network and storage are slow. Over the years, CPU memory and storage components developed their own languages and interfaces that require layers of software to translate CPU memory commands into network and storage commands and vice versa. The speed of the CPU-memory pair relative to network and storage I/O was such that these software layers had minimal impact on system performance. However, network and storage technologies are quickly catching up with CPU-memory speeds and the burden of generations of software layers now becomes significant. To address these concerns, there has been an emergence of physical layer (PHY) technology, namely Gen-Z technology, as a solution to eliminate existing system bottlenecks and significantly improve system efficiency and performance by unifying communication paths and simplifying software.

In the past, with lower bandwidths and less sophisticated PHY technology (e.g., prior to Gen-Z), link reliability was fairly good relative to performance. Forward error correction (FEC) was generally not required, because error detection with retry was an efficient strategy with good performance. In cases where FEC was used, it involved relatively simple encoding and formatting, permitting correction of trivial errors (e.g., isolated bit errors, or short single burst errors). As technology advances have regularly increased achievable bandwidth, stronger and more sophisticated FEC schemes have been introduced. However, low bandwidth overhead has generally been a priority in these existing FEC schemes, resulting in very large code word size and large and complex decoders (e.g. Ethernet). This results in high latency, which is generally acceptable for storage and networking, but not in cases where considering processor to memory accesses with load/store semantics are involved. For example, in many Gen-Z based systems, achieving a lowest possible latency is desirable.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

Figure 1:
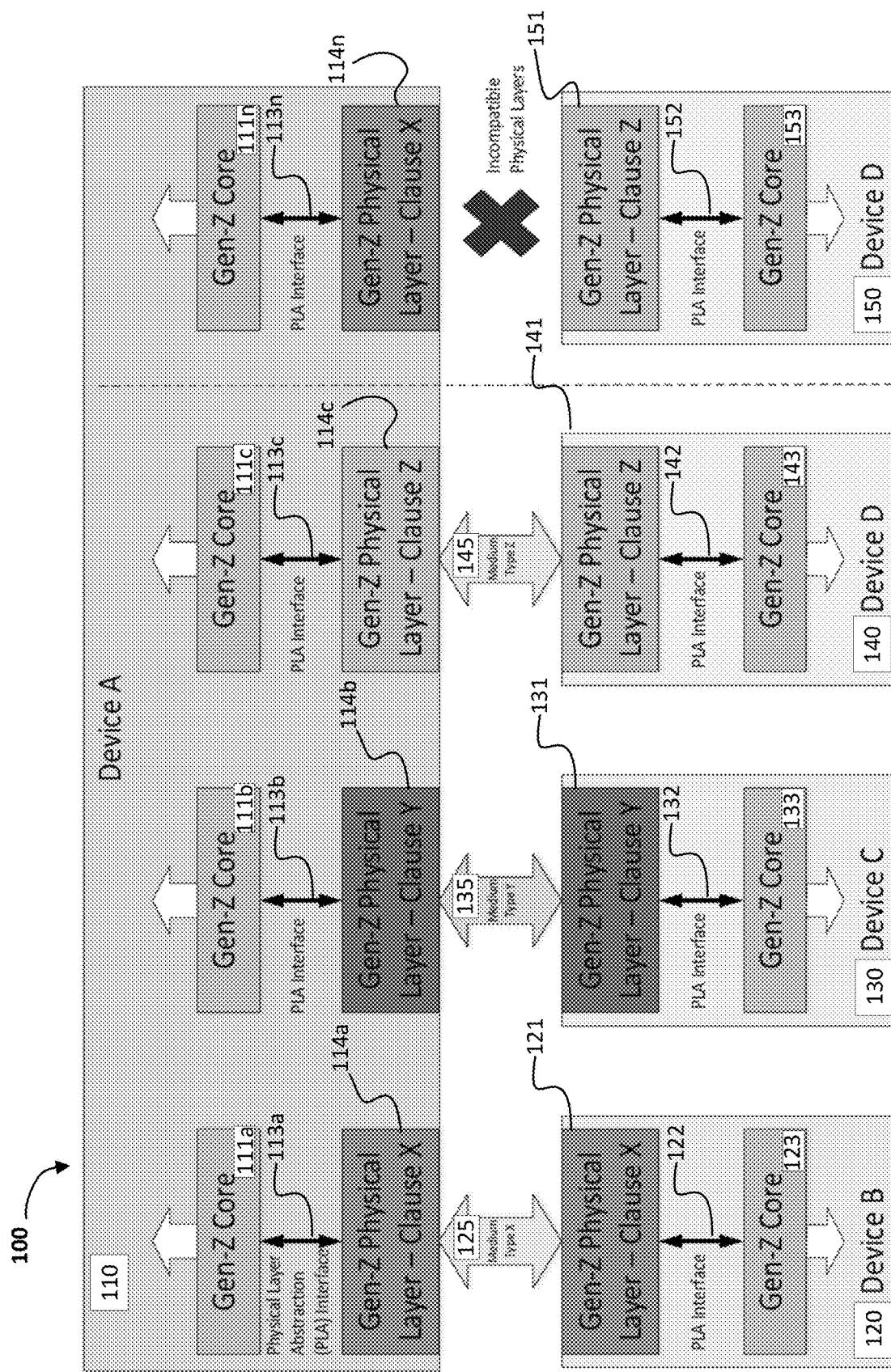
FIG. 1 depicts an example of physical layers (PHYs) that enable communication from GEN-Z Core layers to other devices including forward error correction (FEC) techniques for low latency, according to some embodiments.

The figures are not exhaustive and do not limit the present disclosure to the precise form disclosed.

DETAILED DESCRIPTION

Various embodiments described herein are directed to forward error correction (FEC) techniques that can be used in PHY links that support advanced PHY technology, such as Gen-Z technology. The disclosed FEC techniques are distinctly designed to minimize latency in the PHY links in a manner that is optimal for Gen-Z systems. Implementing low latency FEC techniques, as disclosed herein, provides improvements over many existing FEC schemes that typically employ very large code word sizes and result in high latency, as alluded to above.

As a general description, the disclosed FEC techniques are designed to minimize two contributors to FEC-based latency, namely codeword length and correction latency. That is, the FEC techniques use pre-coding, binary FEC encoding that uses a physical unit formatting (referred to herein as phits), and a control bit sanity check. According to the embodiments, these aspects of the FEC techniques operate interdependently such that latency can be reduced in PHY links, particularly Gen-Z links.

The demand for high-bandwidth, low-latency fabrics for high complexity applications, such as High Performance Computing (HPC) and memory-semantic, continues to grow. However, as interconnect bandwidth has increased, PHY designers have struggled to keep link error rates "invisible" to application performance. In particular, the transition from two-level to four-level Pulse-Amplitude Modulation (PAM4) signaling (where two bits of data are transmitted per symbol) has increased error rates so that simply retrying packets to recover from errors would result in significant performance degradation. Therefore, some link protocols have added FEC schemes to correct link errors at the receiver without requiring retry. Nonetheless, many of these conventional FEC schemes add latency for every link hop. Traditional fabrics like InfiniBand and Ethernet have high-latency FEC, which contributes to reduced performance for latency sensitive applications such as fabric load/store and node-to-node messages. For example, inter-processor messages traverse three switch hops in one direction for a request, and return back another three hops for the response in a 3D HyperX topology. The switch chip can have a 80 ns latency resulting in 480 ns end-to-end switch latency. As an example, FEC for InfiniBand adds 37.8 ns per switch for an additional 226.8 ns end-to-end switch latency. On the other hand, a low-latency FEC scheme that would be able to achieve 2 ns FEC, for example, would only add 12 ns end-to-end through the switch fabric resulting in a significant performance gain and competitive advantage. Accordingly, the disclosed FEC techniques can be applied to links that characteristically have high probability of burst errors, like PAM4 links, and Gen-Z links (having a lower BER) and realize advantage associated with low latency and correction latency in HPC and memory-semantic applications.

FIG. 1 depicts an example of multiple physical layers (PHY) 114a-144n that enable communication from respective GEN-Z Core layers 111a-111n to other devices 120-150. In the example, each of the physical layer clauses 114a-114n on the device 110 can communicate with a Gen-Z Core (also on device 110) via a corresponding Physical Layer Abstraction (PLA) interface 113a-113n. As seen, there are four Gen-Z cores 111a-111n that are on the device 110, where: Gen-Z core 111a can communicate with Gen-Z physical layer—clause X 114a via PLA 113a; Gen-Z core 111b can communicate with Gen-Z physical layer—clause Y 114b via PLA 113b; Gen-Z core 111c can communicate with Gen-Z physical layer—clause Z 114c via PLA 113c; and Gen-Z core 111n can communicate with Gen-Z physical layer—clause X 114n via PLA 113n. Similarly, on the other devices 120, 130, 140, and 150, each of the corresponding physical layer—clauses 121, 131, 141, 151 can communicate with a Gen-Z Core 123, 133, 143, 153 via a corresponding PLA interface 122, 132, 142, 152. Any of the Gen-Z physical layer clauses (e.g., clause X, clause Y, and clause Z) can communicate with a Gen-Z core. However, a physical layer clause can interoperate only with another device supporting the same physical layer clause. For instance, Gen-Z physical layer—Clause X 114a on device 110 can interoperate with the same clause on device 120, which is Gen-Z physical layer—Clause X 121 via a medium type X 125. The example also shows: Gen-Z physical layer—Clause Y 114b on device 110 can interoperate with the Gen-Z physical layer—Clause Y 131 on device 130 via a medium type Y 135; and Gen-Z physical layer—Clause Z 114c on device 110 can interoperate with the Gen-Z physical layer—Clause Z 141 on device 140 via a medium type Z 145. However, the Gen-Z physical layer—Clause X 114n on device 110 cannot interoperate with a different physical layer clause, shown as Gen-Z physical layer—Clause Z 151 on device 150 (indicated by an X). Gen-Z Physical Layer Clauses illustrates how a single Gen-Z Core can communicate with a multitude of devices over different Physical Layers using conceptually named Clauses X, Y, and Z. Gen-Z Physical Layer Clauses also illustrates how clauses shall be compatible in order to establish a communication channel, using Clause X and Clause Z as an example. For purposes of discussion, the Gen-Z clause implemented with respect to the FEC techniques disclosed herein can be Gen-Z-E-PAM4-50G. This particular Gen-Z clause defines a Gen-Z physical layer that is capable of a line-rate at 53.125 GT/s per lane inclusive of the overhead using 4-level Pulse Amplitude Modulation (PAM4) signaling over Fabric media (Medium Reach). Also, different Phit Forward Error Correction (Phit FEC) encodings can be used, Phit FEC 288 which uses a BCH(288, 260) codeword or Phit FEC 320 which uses a BCH(320, 260) codeword. Further, in accordance with the disclosed FEC scheme, additional phit sizes, carrying 256, 512 or 768 bits can also be implemented. Phit FEC 288 has a raw data-rate of 47.222 Gbps and supports a raw BER of 10 or better. Phit FEC 320 has a raw data-rate of 42.5 Gbps and supports a raw BER of $10^{-7}$ or better. Both types of Phit FEC have a corrected BER of $10^{-15}$ or better. A Gen-Z compliant physical layer consists of an electrical interface compatible with a Channel Operating Margin (COM) that has a recommended Insertion Loss1 (IL) no greater than 20 dB at 13.2813 GHz.

As previously described, latency with respect to FEC schemes often originates from two sources, codeword length and correction latency. FEC codeword can be thought of as an "FEC packet" that is composed of a data payload and FEC redundancy. For example, for the device 100 to transfer a packet from its PHY 114a to the PHY 121 of device 120, the entire codeword must be received before the data payload can be consumed by the receiver, namely device 120. Thus, the larger the codeword, the higher the FEC latency, generally. After the entire codeword is received by the PHY 121 of device 120, errors can be detected and corrected at the receiver, which typically involves a pipelined FEC decoder. The greater the correction capability of the FEC, the greater the number of pipeline stages of the FEC decoder and the greater the correction latency. Therefore, a "lowest-latency" FEC scheme would theoretically consist of an extremely small codeword and light-weight error correction (e.g., small number of pipeline stages). The FEC techniques, according to the embodiments, have been designed to move in the direction of "lowest-latency" by reducing the FEC codeword size and correction latency using: pre-coding; Bose-Chaudhuri-Hocquenghem (BCH) encoding; correction bypass; and minimized channel noise (e.g., low BER channel). With each of these aspects working together, the disclosed FEC techniques can be used by systems having advanced PHY technology, such as a Gen-Z system 100, to achieve low latency and error correction (e.g., link reliability) in operation. For instance, in the case of a PAM4 link, the disclosed FEC techniques can achieve a latency as low as 2 ns per-link hop for a four-lane link.

The PHY requirements for Gen-Z technology implement a sufficiently low raw Bit Error Ratio (BER). Accordingly, the disclosed FEC techniques can further leverage this feature of Gen-Z technology for also realizing low latency. Low BER is critical to reducing the number of errors that need to be corrected, which allows for a smaller codeword to be used by the FEC techniques, and thereby minimizes correction latency. As previously described, Gen-Z links can have a raw BER of $10^{-9}$ pre-correction. This can be achieved for both fabric (20 dB Insertion Loss) and local channels (10 dB Insertion Loss), provided certain channel optimizations (e.g., minimization of the channel noise and reflectivity) are made. As an example, a PAM4 212.5 Gbps 4-lane link with a $10^{-9}$ BER can result in one error every 4.7 ms on average, which means the FEC would only need to correct a single error event per codeword in order to achieve $10^{-15}$ BER post-correction. Whereas, Ethernet's supports up to 3.13E-4 raw BER (one error every 147.3 ns), which requires its FEC to support correction of several error events per codeword, leading to increased codeword size and correction latency.

In detail, the disclosed FEC techniques utilize a codeword which is small (to reduce overhead), and limit error correction while providing strong error detection to minimize the chance of silent data corruption. Even though the low raw BER implement in Gen-Z technology generally reduces the likelihood of error occurrences, burst errors can still exist on the link which makes continued use of a FEC scheme desirable. For example, the Decision Feedback Equalizer (DFE), a receiver circuit designed to remove inter-symbol interference (ISI), can cause single error events to propagate into a burst of errors due to its feedback loop. In the worst case, a PAM4 DFE will cause an error to propagate 75% of the time, which produces a new error that also has a 75% chance of propagating. This cycle may repeat until the error stops propagating. Many link protocols deal with this error propagation using Reed-Solomon (RS) FEC that corrects any combination of bit flips per FEC symbol. FEC symbols are usually 8 or 10 bits, and a DFE-induced burst error caused by a single-error event can easily span 3 or more symbols. The effects of burst errors on conventional FEC schemes, such as RS FEC, can lead to increased FEC decoder complexity, area, and latency in order to achieve the necessary correction capability. Many link protocols allow the use of pre-coding as a mechanism for reducing the number of bit flips caused by a DFE burst error.

Figure 2:
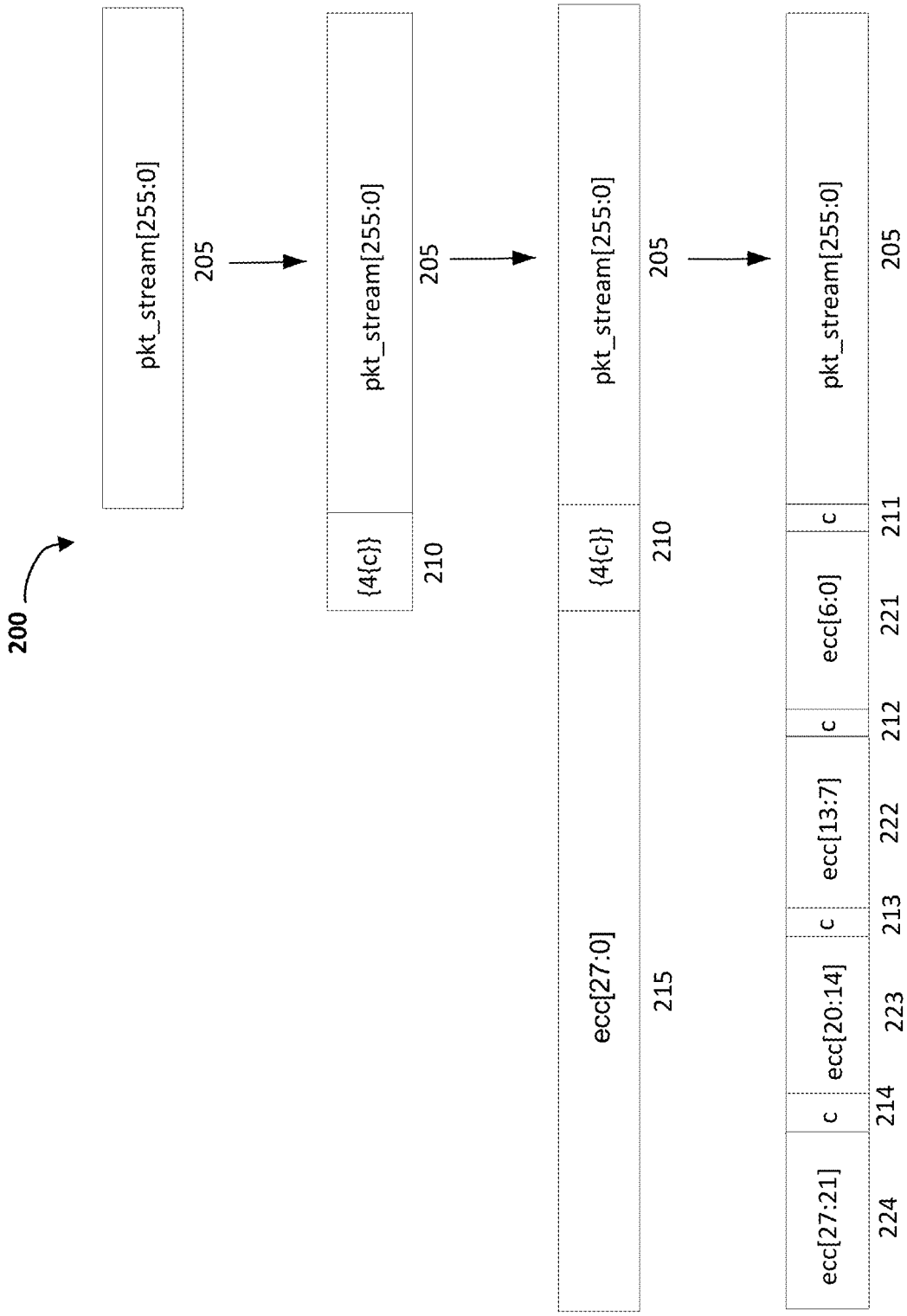
FIG. 2 depicts an example of a physical unit (phit) having a 28 bit codeword that can be employed by the FEC techniques for low latency, according to some embodiments.

The disclosed FEC techniques are based on used of a FEC codeword. As alluded to above, FEC codewords of the embodiments are generally small in size, for instance 288 bits, in order to achieve a low latency. Additionally, the FEC techniques can adjust for higher BER use cases, by employing larger codeword sizes, for instance carrying 512 or 768 packet stream bits. An example of a small codeword for achieving low latency, comprising a 288-bit phit (physical unit), is shown in FIG. 2. In operation, transmit data can be sent from a Gen-Z core (shown in FIG. 1) of a transmitting PHY. The PLA Interface (shown in FIG. 1) of the transmitting PHY handles the transmitting data before that transmit data is communicated over physical links of the fabric to be received by a receiving PHY (decoder). This transmit data can be formatted, by the PLA of the transmitting PHY, as a codeword equipped for forward error correction. The codeword can be generated as phit 200 which carries: 256 bits of Gen-Z packet stream 205, 4 copies of a "control" bit 210; and 28 bits of ECC 215, which is the FEC redundancy (which protects both the packet stream and control bits). The FEC techniques use a binary encoding which permits correction of any 2 bit errors in the phit 200. Particularly, with the use of pre-coding, employing a phit 200 permits correction of any single error event that may affect the codeword. This correction capability provides good performance (e.g., low retry probability) with a maximum BER permitted for this FEC scheme. The binary encoding used to generate the phit 200 is efficient for a small codeword size (relative to conventional multi-byte correcting FEC schemes). Also, using the pre-coding and the phit 200 to limit most correctable errors to 2 bit errors permits a relatively simple decode algorithm (no iteration) to be used at the receiving PHY, with an efficient hardware implementation (low complexity and area). For instance, the disclosed FEC techniques ensures that decoding with corrected errors requires just a few clock cycles, and this latency is easily hidden with a correction bypass path.

FIG. 2 shows the phit 200 implemented as a Phit FEC 288. As seen, the particular format of the phit 200 is 288 bits in size, consisting of: 256 bits of Gen-Z packet stream 205 (not necessarily aligned with packet boundaries); 4 copies of a "ctl" bit 210, which differentiates between Data Sequences and Control Sequences; and 28 bits of FEC parity 215. The Phit 200 encoding is binary BCH (288,260). As previously described, the FEC techniques leverages pre-coding and gray coding such that burst errors introduced by DFE are converted to bit errors. As a result, the Hamming distance can be 8, so this code could potentially be used for correction of errors greater than 2 bits (e.g., 3 bit errors) in the phit 200. Although larger errors may be correctable, restricting correction to 2 bit errors in the FEC techniques are optimal because, as with DFE, the most probable error affecting a phit 200 is a single burst error, which is converted to 2 bit errors by gray coding and pre-coding. In some embodiments, a stronger code than strictly required for 2 bit error correction can be used. The stronger scheme can allow for stronger detection of uncorrectable Phit errors at the receiving PHY, which can supplement packet CRC error protection for improved reliability with higher BER (similar to Phit CRC).

In detail, FIG. 2 serves to illustrate the construction of the phit 200. Constructing, or otherwise generating, the phit 200 can include:

1) Starting with 256 bits of Gen-Z packet stream 205.
2) Appending 4 copies of "ctl" bit 210 (shown as "C" in FIG. 2).
3) Encoding as BCH(288,260) to include FEC parity 215 (shown as "ecc" in FIG. 2).
4) Interspersing the four copies of the "ctl" bit 211, 212, 213, and 214 with the FEC parity bits 221, 222, 223, and 224.

The BCH encoding applied to the phit 200 can be a binary CRC encoding, and the codeword is bit-reversed for transfer on the link, as is common for CRC codes. The "lowest" bit of the packet stream 205 will travel first on the link and the "highest" bit of the FEC parity 215 will travel last. Furthermore, interspersing the ctl bits 210 within the phit 200 can reduce the probability that all of the multiple copies of the ctl bits 211-214 will be affected by a single error event, particularly when the copies of the ctl bits 211-214 travel on separate lanes of the link. In transmission across the fabric, the 288-bit phit 200 can be striped across lanes of the link. For example, the phit 200 is transferred on a four-lane link, where the bits indicated at the top of FIG. 2 travel first on the link. For a four-lane link, the phit 200 is striped across lanes with byte granularity. Moreover, the control bits 210 are used to differentiate between phits carrying Gen-Z packet stream, and phits carrying link level control messages. Thus, the phit 200 format eliminates the need for lower level physical encoding to be added to frame the data on the link with bandwidth overhead (e.g. 128b, 130b) for this purpose (e.g., differentiate between phit packets and control packets).

Figure 3:
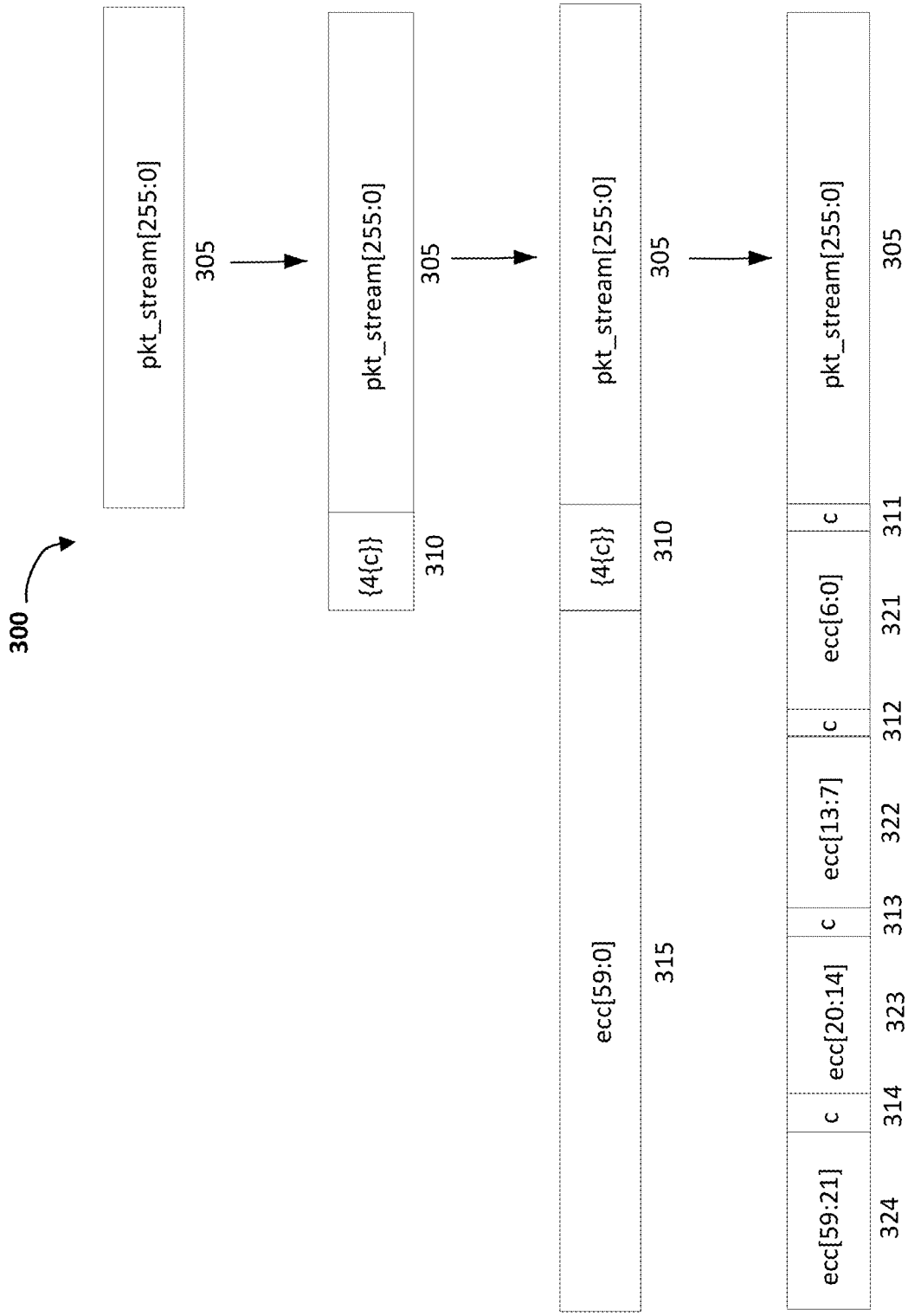
FIG. 3 depicts an example of a phit having a 60 bit codeword that can be employed by the FEC techniques for low latency, according to some embodiments.

Now referring to FIG. 3, an example of FEC codeword comprising a phit 300 implemented as a Phit FEC 320 is depicted. In accordance with Phit FEC 320, each phit 300 is 320 bits in size, consisting of: 256 bits of Gen-Z packet stream 305 (not necessarily aligned with packet boundaries); 4 copies of a "ctl" bit 310; and 60 bits of FEC parity 315. The encoding for phit 300 uses decoder alphabet GF($2^{10}$). The Phit FEC 320 encoding can be binary BCH (320, 260). Again, the FEC techniques using phit 300 leverages pre-coding (and gray coding) such that burst errors introduced by DFE are converted to bit errors. The Hamming distance associated with the phit 300 can be 13, so this code could potentially be used for correction of bit errors greater that 2 bits (e.g., 6 bit errors) in the phit 300. Thus, phit 300, which is a Phit FEC 320, is a larger size than FEC codeword of a FEC Phit 288. Generally, phit 300 can be optimal for links having a higher BER due to its added redundancy (60 ECC bits 315 as compared to 28 bits of redundancy of FEC Phit 288). However, phit 300 may cause greater latency (as compared to FEC Phit 288) with it being a larger FEC codeword. Although the phit 300 can allow for correction of larger bit errors, the disclosed FEC techniques may limit correction to fewer errors (e.g. 4), for reduced decoder complexity/area, and increased detection of uncorrectable errors. The phit 300 can be constructed by:

1) Starting with 256 bits of Gen-Z packet stream 305.
2) Appending 4 copies of "ctl" bit 310 (shown as "C" in FIG. 3).
3) Encoding as BCH(320,260) to include FEC parity 315 (shown as "ecc" in FIG. 3).
4) Interspersing the four copies of the "ctl" bit 311, 312, 313, and 314 with the FEC parity bits 321, 322, 323, and 324.

By employing phits, such as phit 300 (and phit shown in FIG. 2), the disclosed FEC techniques can be a light-weight Forward Error Correction (FEC) scheme that allows correction of most errors, reducing the frequency of transaction retries with higher BER. With the phit 300, correctable errors can be corrected in the receiving PHY before the Phit payload (packet stream 205) is transferred to the Gen-Z Core. If an uncorrectable error is detected, a retry is asserted along with the Phit payload 305. This causes the Gen-Z Link Layer to force detection of a Packet CRC (PCRC) error for any packet that may be affected (same behavior as with Phit CRC).

Generally speaking, there are two different Phit FECs that can be employed by the FEC techniques. For instance, which phit utilized by the FEC techniques can be based on the raw BER of the link. Links having a raw BER of 10 or better can use the Phit FEC 288, and links with a raw BER $10^{-7}$ or better can use the Phit FEC 320. As alluded to above, a Phit FEC 320 may be more optimal in links with a higher BER because of its added redundancy. Both Phit FECs can result in a corrected BER of $10^{-15}$ or better. If raw BER is not sufficiently random to reach a corrected BER of $10^{-15}$ or better, e.g. due to high crosstalk between lanes, the raw BER should be reduced until a corrected BER of $10^{-15}$ or better can be reached.

Additionally, the disclosed FEC techniques can further leverage the use of larger phits, such as FEC Phit 320. In other words, although the phits may be larger, contributing to a greater latency, the phits are also formatted for improved redundancy (e.g., a 60 bit codeword). Accordingly, the FEC techniques also employ phits of multiple variable sizes. In the embodiments, variable size phits can include: phits including 256 bits of Gen-Z packet stream (shown in FIG. 3); phits including 512 bits of Gen-Z packet stream (shown in FIG. 4); and phits including 768 bits of Gen-Z packet stream (shown in FIG. 5) in a manner that enables a tradeoff between bandwidth overhead (e.g., larger number of Gen-Z packet stream bits transmitted in each phit) versus the latency (e.g., smaller phit size). In other words, a variable size phit may be selected by the FEC techniques in order to transmit more data per packet, thereby achieving increasing bandwidth while maintaining low latency.

Figure 4:
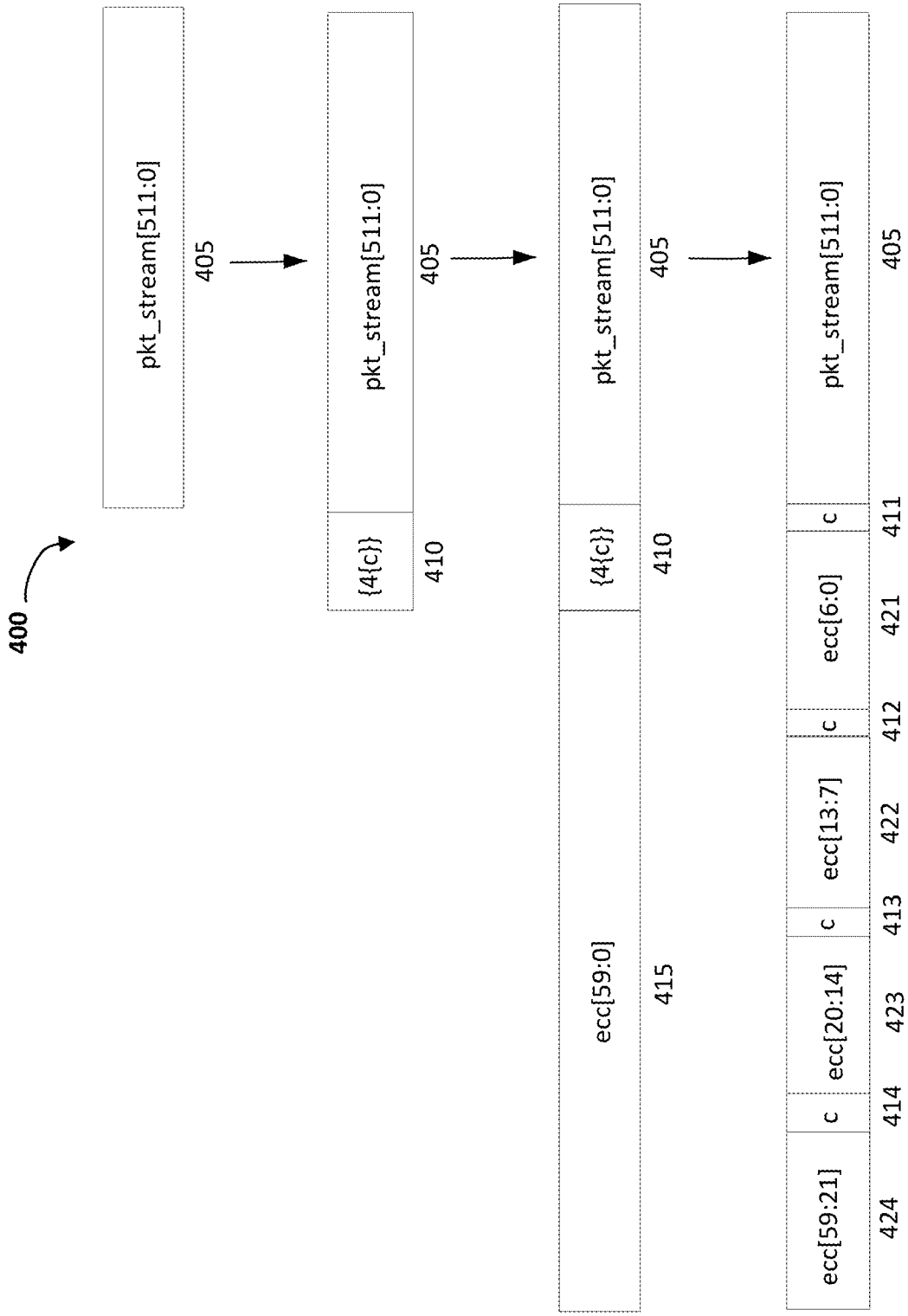
FIG. 4 depicts an example of a variable size phit that can be employed by the FEC techniques for low latency, according to some embodiments.
Figure 5:
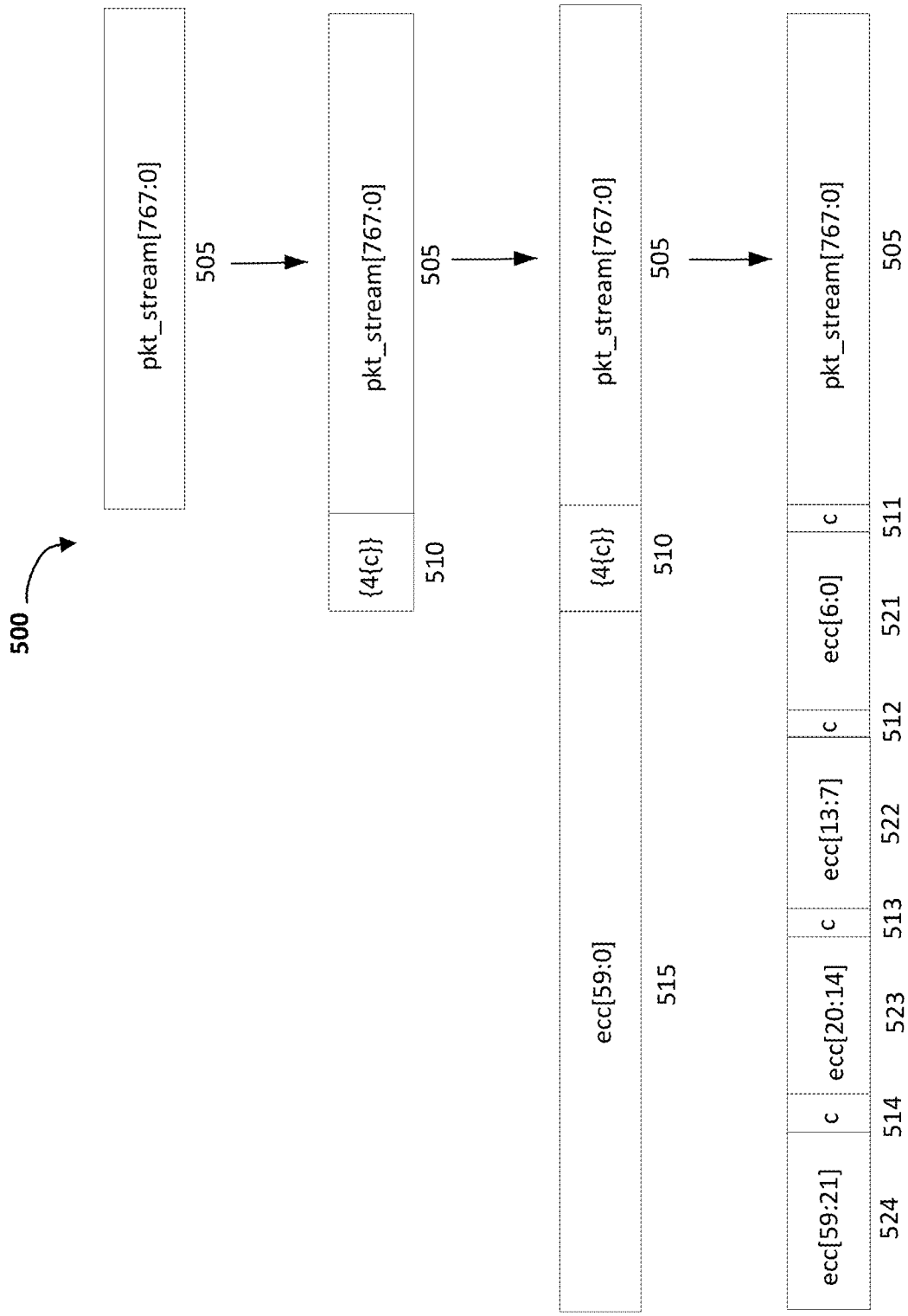
FIG. 5 depicts another example of a variable size phit that can be employed by the FEC techniques for low latency.

Referring now to FIG. 4 and FIG. 5, examples of variable size phits are illustrated. Elements and functionality of the phit 400 in FIG. 4 are substantially similar to the phit shown in FIG. 3. Thus, for purposes of brevity details similar to the phit described in reference to FIG. 3 are not described again in detail in reference to FIG. 4. Phit 400 can have a format consisting of: 512 bits of Gen-Z packet stream 405 (not necessarily aligned with packet boundaries); 4 copies of a "ctl" bit 410; and 60 bits of FEC parity 415. As compared to FEC phit 320, phit 400 is formatted to transmit twice the amount of data per packet by including 512 bits Gen-Z packet stream.

In FIG. 5, another example of variable size phit 500 is depicted. Again, elements and functionality of the phit 500 in FIG. 5 are substantially similar to the phit shown in FIG. 3. Thus, for purposes of brevity details similar to the phit described in reference to FIG. 3 are not described again in detail in reference to FIG. 5. Phit 500 can have a format consisting of: 768 bits of Gen-Z packet stream 505 (not necessarily aligned with packet boundaries); 4 copies of a "ctl" bit 510; and 60 bits of FEC parity 515. As compared to FEC phit 320, phit 500 is formatted to transmit three times the amount of data per packet by including 768 bits Gen-Z packet stream. Therefore, using the phit 500 (or phit shown in FIG. 5) can lead to increased bandwidth and a lower latency than many existing FEC schemes.

Figure 6:
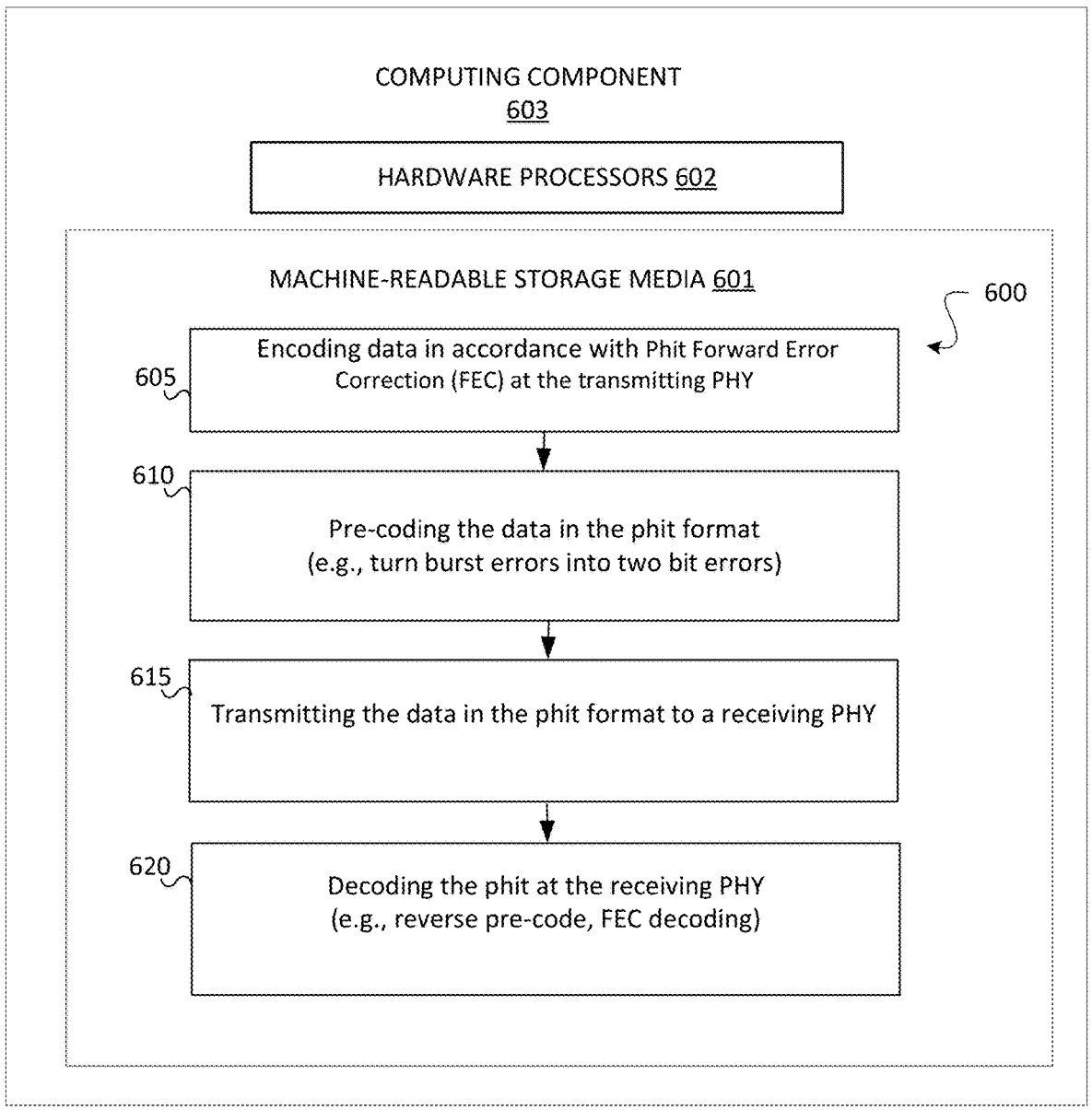
FIG. 6 is an operation flow diagram of a process for executing the disclosed FEC techniques for low latency, according to some embodiments.

Referring now to FIG. 6, an example of a process 600 for implementing the FEC techniques for low latency is shown. The process 600 is illustrated as a series of executable operations in a machine-readable storage media 601 performed by a hardware processor 602. The computing component 603 can be a computer device implementing Gen-Z technology for its PHY, as previously described.

At operation 605, data can be encoded in accordance with Phit Forward Error Correction (FEC). Transmit data can be sent from a Gen-Z core over the PLA Interface to the PHY of the device transmitting the data, also referred to as the transmitting PHY. This data can be encoded at operation 605 in accordance with Phit Forward Error Correction (FEC). That is, the data is encoded to be formatted into phit "packets", which allows protection of the data as it is transmitted on the physical link. As disclosed throughout, the use of phits in the FEC techniques allows for burst error to be correctable (and detection) in manner that enhances link reliability and reduces the number of transaction retries. The encoding of operation 605 can be BCH encoding. Encoding of operation 605 can particularly involve formatting the data into any of the phits described in reference to FIG. 3-FIG. 5 above. Thus, the data can be encoded during operation 605 to generate phits formatted as FEC phit 288, FEC phit 320, or a variable size phits. A FEC codeword comprising the phit can be the result of operation 605.

Next, at operation 610, the data is pre-coded. Generally, pre-coding the data in operation 610 can help turn burst errors, caused by the receiver DFE, into two single bit errors and can be useful when remapping Gen-Z to a higher transfer rate than the default. In other words, pre-coding helps to reduce bit flips caused by DFE-induced burst errors. As previously described, one of the aspects of the disclosed FEC techniques is pre-coding. Pre-coding is a method of encoding data at the transmitting PHY that, in most cases, causes DFE-induced burst errors to turn into two bit flips (a single-bit flip at the start of the burst and a single-bit flip at the end of the burst). As background, when Serializer/Deserializer (SERDES) link errors are analyzed, there are usually two main factors to consider: (1) Bit Error Rate (BER), which determines the frequency of independent errors; and (2) Decision Feedback Equalizer (DFE) error propagation, whereby there is a certain probability that an independent error will propagate to subsequent symbols. These factors are interdependent, as aggressive DFE tap weights (intended to minimize BER) generally result in a higher probability of error propagation (longer burst errors). In other words, strategies that reduce the frequency of errors tend to result in more severe (less easily corrected) errors.

When considering the burst errors resulting from DFE error propagation, pre-coding (for NRZ or PAM4) is a useful method for converting long burst errors to isolated bit errors. In general, a single burst can be converted to 2 bit errors (e.g., entry and exit bit errors). Pre-coding has been proposed and enabled in-various standards (e.g. 802.3) but has not been widely used. With a large variability in channel quality (resulting from a variety of routing topologies, cables connectors, etc.), there tends to be pathological scenarios where pre-coding is not optimal (e.g., does not convert a burst error to 2 bit errors with high probability). This has resulted in a perception of risk such that FEC schemes have been designed with no dependence on pre-code (i.e. requiring correction of long burst errors). However, with Gen-Z technology, the PHY specification is much more restrictive with respect to supported channel topologies. This makes it so that pre-coding is more optimal, and can work well in expected real-world scenarios. Therefore, FEC techniques for use in Gen-Z leverages the use of pre-coding, and benefits from it in various ways.

However, no link protocol fully relies on pre-coding for mitigating DFE burst errors. Instead, pre-coding is an optional feature. Fully relying on pre-coding is risky because pre-coding effectiveness varies depending on the channel. Also, pre-coding can cause more bit flips in cases where the DFE does not propagate bit errors. For example, if an error event produces a single-bit error that is not propagated by the DFE, pre-coding will turn that single-bit flip into a double-bit flip. That is, pre-coding is performed in operation 610 to enhance the burst error detection and correction of the process 600 (but it not the only mechanism employed).

It can be assumed that the process 600 has converted DFE produced burst errors to only two errors, entry and exit errors on 20 contiguous UI patterns after the data is pre-coded in operation 605. Then, the process 600 can proceed to operation 615 where the data is transmitted in the phit format to the receiving PHY. The data can be transmitted in operation 615 serially by the lane drivers over the electrical or optical physical medium. Further, the phit can be striped across lanes when it is transmitted, which protects the control bits of the phit in a reliable way. For example, transmitting in operation 615 can include transferred phits on a four-lane link, where the phit is striped across lanes with byte granularity. Even further, the codeword used by process 600 is a small size (e.g., due to pre-coding and enhanced BER), in a manner that allows the FEC techniques to achieve low latency.

When a phit successfully arrives at the receiving PHY, the receive PHY can begin the process of decoding of the FEC codeword at operation 620. Operation 620 can involve a reverse pre-coding of the received data. As a general description, reverse pre-coding is a process that reverses the effect of pre-coding the data, as performed in previous operation 610 (at the transmitting PHY). The receiving PHY may perform reverse pre-coding before the FEC decode.

Decoding of operation 620 can involve, reversing the final step of phit construction. So, for example, the four copies of the "ctl" bit and the 256 bits of the packet stream are once again a contiguous payload in the FEC codeword. The codeword can be bit-reversed if necessary (depends on decoder implementation). Then, FEC decoding can be performed on the codeword. As alluded to above, because the pre-coding has been performed at the transmitting PHY, decoding at the receiving PHY can be light-weight by restricting correction to 2 bit errors. addition to the FEC decode/correction. Additionally, decoding at operation 620 can include a sanity check. The sanity check is performed to make sure the corrected copies of the control bit all agree. For example, the process 600 can check for identical (corrected) copies of the "ctl" bit in the received phit. If the sanity check is successful, then any errors in the phit can be considered corrected by the FEC techniques. However, if the sanity check fails, then the phit is treated as FEC uncorrectable (resulting in retry of affected packets). For instance, if all four copies of "ctl" bit are not identical, then link resynchronization can be initiated for a transaction re-try.

Figure 7:
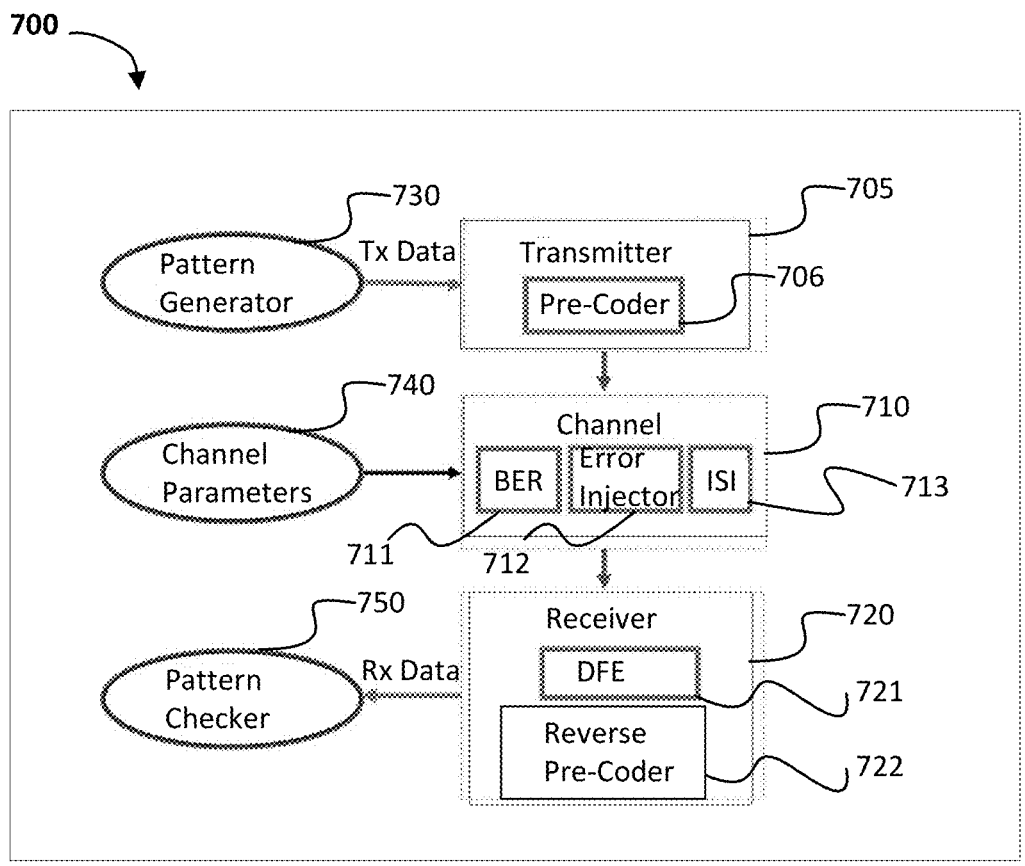
FIG. 7 depicts an example of a physical channel analysis tool for emulating behavior of transmitter/receiver equalization and verification of the disclosed FEC techniques, according to some embodiments.

Referring now to FIG. 7, a physical channel analysis tool 700 for emulating behavior of transmitter/receiver equalization and verifying the disclosed FEC techniques is depicted. According to the embodiment, the model may be implemented as software, hardware, or a combination thereof. The physical channel analysis tool 700 consists of: a transmitter 705 including a pre-coder 706; a channel 710 including a BER modeler 711 which injects noise to model the BER, an error injector 712, and an ISI injector 713; and a receiver 720 that includes a DFE 721 that removes ISI, and a reverse pre-coder 722.

A pattern generator 730 can create transmitter data which is pre-coded by the pre-coder 706 at the transmitter 705. Then, the pre-coded data can be modified by the channel 710. The channel 710 can inject a single-bit error that is propagated by the DFE 721 at the receiver 720, and then reverse pre-coded by the reverse pre-coder 722. The resulting receiver data is received by a pattern checker 750 in order to be checked for errors. The error pattern and burst length can be recorded by the pattern checker to determine pre-coding effectiveness. For example, the physical channel analysis tool 700 can emulate a wide range of channels and transmit data. According to some results of the physical channel analysis tool 700, pre-coding was 99.9% effective in transforming DFE-induced burst errors into two bit errors. This allows the FEC techniques to utilize binary BCH encoding with error correction constrained to two bit flips to correct an entire error event including DFE error propagation, thereby requiring a less complex decoder and performing stronger error detection.

Figure 8:
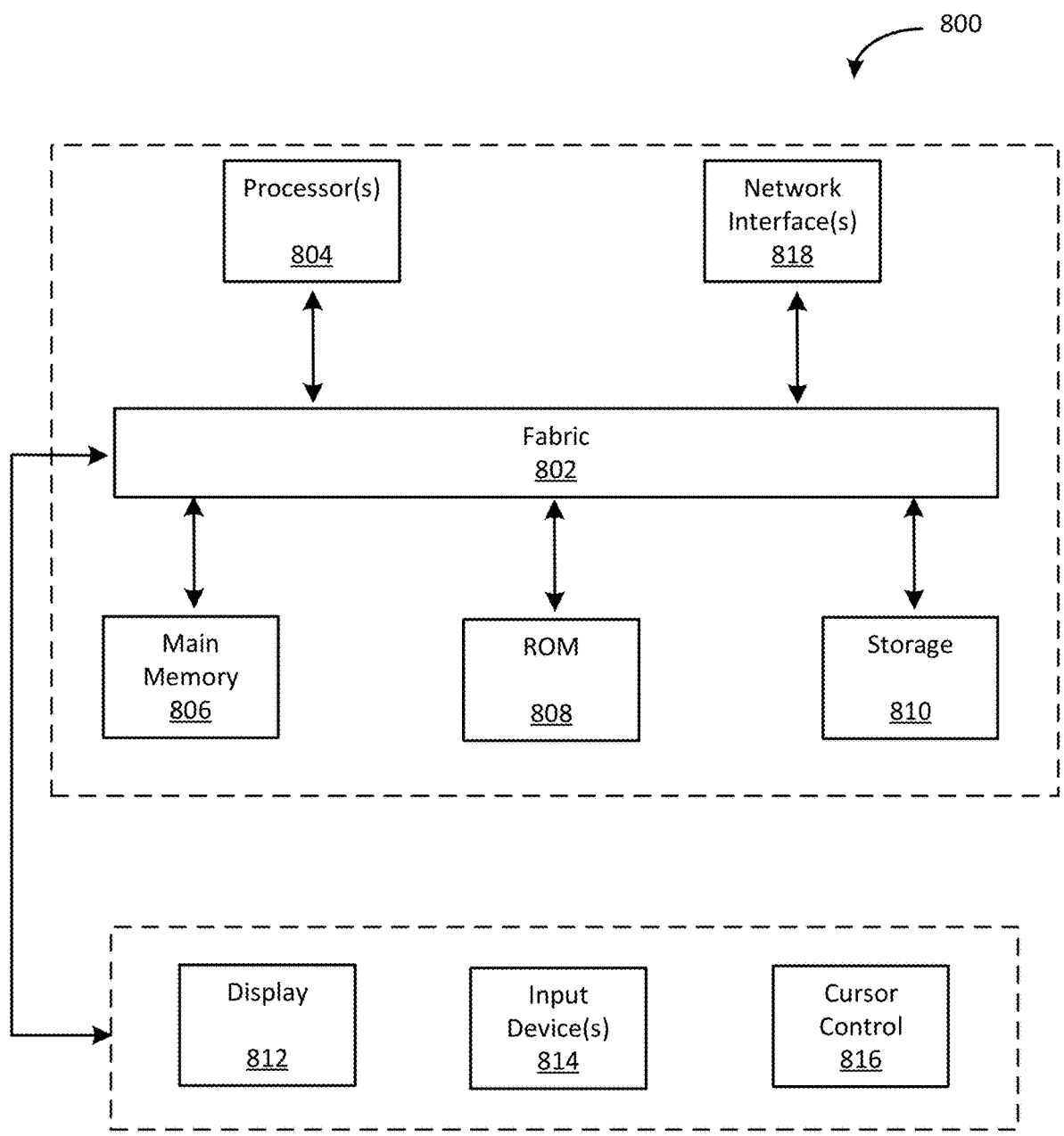
FIG. 8 illustrates an example computer system that may include PHY shown in FIG. 1, according to some embodiments.

FIG. 8 depicts a block diagram of an example computer system 800 in which the FEC techniques described herein may be implemented. The computer system 800 includes a fabric 802 or other communication mechanism for communicating information, one or more hardware processors 804 coupled with fabric 802 for processing information. Hardware processor(s) 804 may be, for example, one or more general purpose microprocessors.

The computer system 800 also includes a main memory 806, such as a random-access memory (RAM), cache and/or other dynamic storage devices, coupled to fabric 802 for storing information and instructions to be executed by processor 804. Main memory 806 also may be used for storing temporary variables or other intermediate information during execution of instructions to be executed by processor 804. Such instructions, when stored in storage media accessible to processor 804, render computer system 800 into a special-purpose machine that is customized to perform the operations specified in the instructions.

The computer system 800 further includes storage devices 810 such as a read only memory (ROM) 808 or other static storage device coupled to fabric 802 for storing static information and instructions for processor 804. A storage device 810, such as a magnetic disk, optical disk, or USB thumb drive (Flash drive), etc., is provided and coupled to fabric 802 for storing information and instructions.

The computer system 800 may be coupled via fabric 802 to a display 812, such as a liquid crystal display (LCD) (or touch screen), for displaying information to a computer user. An input device 814, including alphanumeric and other keys, is coupled to fabric 802 for communicating information and command selections to processor 804. Another type of user input device is cursor control 816, such as a mouse, a trackball, or cursor direction keys for communicating direction information and command selections to processor 804 and for controlling cursor movement on display 812. In some embodiments, the same direction information and command selections as cursor control may be implemented via receiving touches on a touch screen without a cursor.

The computing system 800 may include a user interface module to implement a GUI that may be stored in a mass storage device as executable software codes that are executed by the computing device(s). This and other modules may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables.

In general, the word "component," "engine," "system," "database," data store," and the like, as used herein, can refer to logic embodied in hardware or firmware, or to a collection of software instructions, possibly having entry and exit points, written in a programming language, such as, for example, Java, C or C++. A software component may be compiled and linked into an executable program, installed in a dynamic link library, or may be written in an interpreted programming language such as, for example, BASIC, Perl, or Python. It will be appreciated that software components may be callable from other components or from themselves, and/or may be invoked in response to detected events or interrupts. Software components configured for execution on computing devices may be provided on a computer readable medium, such as a compact disc, digital video disc, flash drive, magnetic disc, or any other tangible medium, or as a digital download (and may be originally stored in a compressed or installable format that requires installation, decompression or decryption prior to execution). Such software code may be stored, partially or fully, on a memory device of the executing computing device, for execution by the computing device. Software instructions may be embedded in firmware, such as an EPROM. It will be further appreciated that hardware components may be comprised of connected logic units, such as gates and flip-flops, and/or may be comprised of programmable units, such as programmable gate arrays or processors.

The computer system 800 may implement the techniques described herein using customized hard-wired logic, one or more ASICs or FPGAs, firmware and/or program logic which in combination with the computer system causes or programs computer system 800 to be a special-purpose machine. According to one embodiment, the techniques herein are performed by computer system 800 in response to processor(s) 804 executing one or more sequences of one or more instructions contained in main memory 806. Such instructions may be read into main memory 806 from another storage medium, such as storage device 810. Execution of the sequences of instructions contained in main memory 806 causes processor(s) 804 to perform the process steps described herein. In alternative embodiments, hard-wired circuitry may be used in place of or in combination with software instructions.

As used herein, a circuit might be implemented utilizing any form of hardware, software, or a combination thereof. For example, one or more processors, controllers, ASICs, PLAs, PALs, CPLDs, FPGAs, logical components, software routines or other mechanisms might be implemented to make up a circuit. In implementation, the various circuits described herein might be implemented as discrete circuits or the functions and features described can be shared in part or in total among one or more circuits. Even though various features or elements of functionality may be individually described or claimed as separate circuits, these features and functionality can be shared among one or more common circuits, and such description shall not require or imply that separate circuits are required to implement such features or functionality. Where a circuit is implemented in whole or in part using software, such software can be implemented to operate with a computing or processing system capable of carrying out the functionality described with respect thereto, such as computer system 800.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. A method for performing forward error correction (FEC) on data transferred on a data link on the physical layer, comprising:
    performing a binary encoding of the data in accordance with a physical unit (phit) FEC format, wherein the phit FEC format allows for correction of two bit errors in the phit FEC format and comprises a codeword having a variable bit size;
    pre-coding the phit such that burst errors associated with the link are converted into bit errors; and
    transmitting the data in the phit FEC format to a receiving PHY, wherein correctable two bit errors at one or more locations within the phit FEC format are corrected by decoding at the receiving PHY in accordance with the phit FEC.

2. The method of claim 1, wherein the phit FEC format comprises:
    bits of Gen-Z packet stream;
    four copies of a control bit; and
    bits of FEC parity.

3. The method of claim 2, wherein the four control bit copies are used to differentiate between phits carrying packet stream, and phits carrying link level control messages.

4. The method of claim 2, wherein the four copies of the control bit are transported on different lanes of the link.

5. The method of claim 4, wherein decoding at the receiving PHY further comprises:
    performing a sanity check of the data in the phit FEC format at the receiving PHY, wherein the sanity check determines whether each of the four control bit of the phit FEC format agree; and
    in response to determining that the four control bits of the phit FEC format agree, determining that two bit errors within the phit FEC format are correctable and correcting the two bit errors at the receiving PHY.

6. The method of claim 5, further comprising:
    in response to determining that the four control bits of the phit FEC format do not agree, determining that two bit errors within the phit FEC format are not correctable and requesting a retry of transmitting the data.

7. The method of claim 4, wherein two bit errors are corrected at the receiving PHY before a payload of the phit is transferred to a core.

8. The method of claim 2, wherein the variable bit sizes of the codeword in the phit FEC format comprise: 256 bits of the packet stream; 512 bit of the packet stream; or 768 bits of the packet stream.

9. The method of claim 8, wherein the variable bit sizes of the phit FEC format comprise 28 bits of FEC parity.

10. The method of claim 8, wherein the variable bit sizes of the phit FEC format comprise 60 bits of FEC parity.

11. The method of claim 10, wherein the FEC parity allows correction of up to 6 bit errors in the phit FEC format.

12. The method of claim 1, wherein decoding at the receiving PHY is associated with efficient hardware implementation and reduced latency.

13. The method of claim 8, wherein a selected variable bit size of the codeword for encoding the data in the phit FEC format is based on a maximum bit error rate (BER) of the link.

14. A system for determining an effectiveness of forward error correction (FEC), comprising:
a pattern generator for generating transmitter data;
a channel for receiving the transmitter data from the patter generator, wherein the channel injects a single-bit error to the transmitter data; and
a receiver for receiving pre-coded data from the channel, wherein upon receiving the pre-coded data from the channel the receiver checks the pre-coded data for errors and records an error pattern and burst length to determine the pre-coding effectiveness.

15. The system of claim 14, wherein the pattern generator comprises a pre-coder for applying pre-coding to the transmitter data prior to being received by the channel.

16. The system of claim 14, wherein the receiver comprises a Decision Feedback Equalizer (DFE) for removing inter-symbol interference (ISI) injected in the transmitter data.

17. The system of claim 14, wherein the receiver comprises a reverse pre-coder for performing a reverse pre-coding of the transmitter data.

18. The system of claim 14, wherein the pre-coding effectiveness comprises an effectiveness associated with transforming DFE-induced burst errors into two bit errors.

19. A machine-readable non-transitory storage medium comprising instructions executable by a processor, the instructions programming the processor to:
perform a binary encoding of the data in accordance with a physical unit (phit) FEC format, wherein the phit FEC format allows for correction of two bit errors in the phit FEC format and comprises a codeword having a variable bit size;
pre-code the phit such that burst errors associated with the link are converted into bit errors; and
transmit the data in the phit FEC format to a receiving PHY, wherein correctable two bit errors at one or more locations within the phit FEC format are corrected by decoding at the receiving PHY in accordance with the phit FEC.

20. The machine-readable non-transitory storage medium of claim 19, the instructions programming the processor to:
decode received data from a transmitting PHY in accordance with the phit FEC, wherein the decoding comprises:
performing a sanity check of the data in the phit FEC format, wherein the sanity check determines whether four control bit of the phit FEC format agree; and
in response to determining that the four control bits of the phit FEC format agree, determining that two bit errors within the phit FEC format are correctable and correcting the two bit errors.

* * * * *